(12) United States Patent
Raschke et al.

(10) Patent No.: US 12,013,648 B2
(45) Date of Patent: Jun. 18, 2024

(54) RETICLE POD INCLUDING MOTION LIMITING FEATURES AND METHOD OF ASSEMBLING SAME

(71) Applicant: ENTEGRIS, INC., Billerica, MA (US)

(72) Inventors: Russ V. Raschke, Chanhassen, MN (US); Brian Wiseman, Glencoe, MN (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/982,176

(22) Filed: Nov. 7, 2022

(65) Prior Publication Data

US 2023/0148165 A1 May 11, 2023

Related U.S. Application Data

(60) Provisional application No. 63/277,188, filed on Nov. 9, 2021.

(51) Int. Cl.
| | | |
|---|---|---|
| *G03F 9/00* | (2006.01) | |
| *G03F 1/66* | (2012.01) | |

(52) U.S. Cl.
CPC .............. *G03F 9/7011* (2013.01); *G03F 1/66* (2013.01)

(58) Field of Classification Search
CPC .................. G03F 1/66; G03F 9/7011
See application file for complete search history.

(56) References Cited

U.S. PATENT DOCUMENTS

| | | |
|---|---|---|
| 2006/0109449 A1 | 5/2006 | Matsutori et al. |
| 2014/0183076 A1 | 7/2014 | Kolbow et al. |
| 2015/0266660 A1 | 9/2015 | Lystad et al. |
| 2018/0210349 A1* | 7/2018 | Hsueh ............... H01L 21/67353 |
| 2019/0101821 A1* | 4/2019 | Hsu .................... H01L 21/67359 |
| 2021/0116821 A1* | 4/2021 | Chuang ............. H01L 21/67376 |

FOREIGN PATENT DOCUMENTS

| | | |
|---|---|---|
| JP | 3076497 B2 | 8/2000 |
| TW | 202136131 A | 10/2021 |

* cited by examiner

*Primary Examiner* — Peter B Kim (57) ABSTRACT

Reticle pods include inner pods where motion limiting features restrict translational motion of the cover and the baseplate relative to one another. The motion limiting features are in addition to gross alignment features included in the inner pod. The motion limiting features resist the translational motion before the gross alignment features would resist the motion. Motion limiting features can include elastic bodies providing friction against contact surfaces, or pins received on elastic contact surfaces or in diaphragms or motion limiting cups.

6 Claims, 8 Drawing Sheets

RETICLE POD INCLUDING MOTION LIMITING FEATURES AND METHOD OF ASSEMBLING SAME

PRIORITY

This disclosure claims priority to U.S. provisional patent No. 63/277,188 with a filing date of Nov. 9, 2021. The priority document is incorporated by reference herein.

FIELD

This disclosure is directed to reticle pods, particularly reticle pods including fine as well as gross alignment features.

BACKGROUND

Reticle pods can be used to hold reticles, for example to secure the reticles during processing such as photolithography, including extreme ultraviolet (EUV) processes. The reticle pods can include outer pods and an inner pod, with the inner pod including a cover and a baseplate. The cover and baseplate can be made of hard materials, such as metal. Relative movement of the cover and baseplate can result in rubbing of the hard materials, in turn resulting in the generation of particles from wearing where the surfaces of the cover and baseplate rub against one another.

SUMMARY

This disclosure is directed to reticle pods, particularly reticle pods including fine as well as gross alignment features.

Reticle pods according to embodiments can be used in processes such as, for example, extreme ultraviolet (EUV) processes. Motion limiting features can be provided to improve the relative positioning of the cover and baseplate of the reticle pod. The motion limiting features can restrict smaller relative movements of the cover and the baseplate, reducing rubbing of the cover and baseplate to in turn reduce particle generation during use of the reticle pods. This can improve the purity of processes conducted using the reticle pods, increasing yields and reducing loss from particle contamination, misalignment of pod components, and the like.

In an embodiment, a reticle pod includes an inner pod including a baseplate and a cover. The inner pod includes at least one gross alignment feature and a plurality of motion limiting features. Each of the plurality of motion limiting features includes an alignment retention cutout formed in one of the cover or the baseplate and an elastic bodies disposed in the alignment retention cutout. The elastic body is configured to contact both of the baseplate and the cover when the inner pod is assembled. The plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

In an embodiment, a reticle pod includes an inner pod including a baseplate and a cover. The inner pod includes at least one gross alignment feature and a plurality of motion limiting features. Each of the plurality of motion limiting features includes a mating pin extending from one of the cover or the baseplate, and an elastic contact surface provided on the other of the cover or the baseplate. The mating pin is configured to contact the elastic contact surfaces when the inner pod is assembled. The plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

In an embodiment, the elastic contact surface is provided on an elastic body, the elastic body including a hollow portion opposite a surface where the mating pin is configured to contact said elastic contact surface.

In an embodiment, each of the mating pins is disposed in a mating pin channel, each mating pin channel formed in the one of the cover or the baseplate.

In an embodiment, a reticle pod includes an inner pod including a baseplate and a cover. The inner pod includes at least one gross alignment feature and a plurality of motion limiting features. Each of the plurality of motion limiting features includes a diaphragm disposed in one of the cover or the baseplate and a pin extending from the other of the cover or the baseplate, the pin configured to contact the diaphragm when the inner pod is assembled. The diaphragm has a resistance to deformation in a direction in plane with the cover or the baseplate that is greater than a resistance to deformation in a direction perpendicular to a plane of the cover or the baseplate. Each of the pins have a taper at an end configured to contact one of the plurality of diaphragms. The plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

In an embodiment, each of the motion limiting features includes an alignment retention cutout configured to accommodate the diaphragm and a retention ring configured to retain the diaphragm in the alignment retention cutout.

In an embodiment, the pin is disposed in a pin channel formed in the one of the cover or the baseplate.

In an embodiment, a reticle pod includes an inner pod including a baseplate and a cover. The inner pod includes at least one gross alignment feature and a plurality of motion limiting features. Each of the plurality of motion limiting features includes a motion limiting pin extending from one of the cover or the baseplate and a motion limiting cup provided in the other of the cover or the baseplate. The motion limiting pin is configured to be contacted by a plurality of distinct surfaces of the motion limiting cup when the inner pod is assembled. The plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

In an embodiment, the motion limiting cup is formed directly in one of the cover or the baseplate.

In an embodiment, the motion limiting cup is formed in an insert, the insert configured to be received in a recess formed in one of the cover or the baseplate.

In an embodiment, a method of securing an inner pod of a reticle pod includes engaging one or more gross alignment features included on one of a cover and a baseplate with the other of the cover and the baseplate, and engaging each of a plurality of motion limiting features provided on one of the cover or the baseplate with the other of the cover or the baseplate. The plurality of motion limiting features includes a plurality of alignment retention cutouts and a plurality of elastic bodies. Each elastic body is disposed in one of the alignment retention cutouts, and each of the plurality of elastic bodies is configured to contact both of the baseplate and the cover when the inner pod is assembled. When a force having a component in plane with the cover or the baseplate acts on the inner pod, the engagement of the motion limiting features provides resistance to the component of the force before the engagement of the cover gross alignment features with the baseplate gross alignment features provide resistance to the component of the force. In an embodiment, a reticle is located within the inner pod, and the method further includes placing the inner pod within an outer pod of the reticle pod and securing the outer pod to enclose the reticle pod and subjecting the inner pod to an extreme ultraviolet process.

In an embodiment, a method of securing an inner pod of a reticle pod includes engaging one or more gross alignment features included on one of a cover and a baseplate with the other of the cover and the baseplate and engaging each of a plurality of motion limiting features provided on one of the cover or the baseplate with the other of the cover or the baseplate. The plurality of motion limiting features includes a plurality of mating pins extending from one of the cover or the baseplate and a plurality of elastic contact surfaces on the other of the cover or the baseplate. Each of the plurality of mating pins is configured to contact one of the elastic contact surfaces. When a force having a component in plane with the cover or the baseplate acts on the inner pod, the engagement of the motion limiting features provides resistance to the component of the force before the engagement of the cover gross alignment features with the baseplate gross alignment features provide resistance to the component of the force. In an embodiment, a reticle is located within the inner pod, and the method further includes placing the inner pod within an outer pod of the reticle pod and securing the outer pod to enclose the reticle pod and subjecting the inner pod to an extreme ultraviolet process.

In an embodiment, a method of securing an inner pod of a reticle pod includes engaging one or more gross alignment features included on one of a cover and a baseplate with the other of the cover and the baseplate and engaging each of a plurality of motion limiting features provided on one of the cover or the baseplate with the other of the cover or the baseplate. The plurality of motion limiting features includes a plurality of diaphragms, each of the plurality of diaphragms disposed in one of the cover or the baseplate and a plurality of pins extending from the other of the cover or the baseplate. Each of the plurality of pins is configured to contact one of the plurality of diaphragms when the inner pod is assembled. Each of the plurality of diaphragms has a resistance to deformation in a direction in plane with the cover or the baseplate that is greater than a resistance to deformation in a direction perpendicular to a plane of the cover or the baseplate. Each of the pins have a taper at an end configured to contact one of the plurality of diaphragms. When a force having a component in plane with the cover or the baseplate acts on the inner pod, the engagement of the motion limiting features provides resistance to the component of the force before the engagement of the cover gross alignment features with the baseplate gross alignment features provide resistance to the component of the force. In an embodiment, a reticle is located within the inner pod, and the method further includes placing the inner pod within an outer pod of the reticle pod and securing the outer pod to enclose the reticle pod and subjecting the inner pod to an extreme ultraviolet process.

In an embodiment, a method of securing an inner pod of a reticle pod includes engaging one or more gross alignment features included on one of a cover and a baseplate with the other of the cover and the baseplate and engaging each of a plurality of motion limiting features provided on one of the cover or the baseplate with the other of the cover or the baseplate. The plurality of motion limiting features includes a plurality of motion limiting pins extending from one of the cover or the baseplate and a plurality of motion limiting cups provided in the other of the cover or the baseplate. Each of the plurality of motion limiting pins is configured to be contacted by a plurality of distinct surfaces of one of the plurality of motion limiting cups when the inner pod is assembled. When a force having a component in plane with the cover or the baseplate acts on the inner pod, the engagement of the motion limiting features provides resistance to the component of the force before the engagement of the cover gross alignment features with the baseplate gross alignment features provide resistance to the component of the force. In an embodiment, a reticle is located within the inner pod, and the method further includes placing the inner pod within an outer pod of the reticle pod and securing the outer pod to enclose the reticle pod and subjecting the inner pod to an extreme ultraviolet process.

In an embodiment, a reticle pod includes an inner pod including a baseplate and a cover. The inner pod includes at least one gross alignment feature and a plurality of motion limiting features. Each of the plurality of motion limiting features includes a pin extending from the cover on a side of the cover configured to face the baseplate when the inner pod is assembled, a slot formed in the baseplate, the slot configured to receive the pin, and a flexible member configured to cover the slot on a side of the baseplate opposite the cover when the inner pod is assembled. The flexible member includes a contact surface configured to be contacted by an end of the pin, the flexible member configured such that the contact surface can be deflected by contact with the pin.

In an embodiment, the inner pod includes at least three of the motion limiting features. In an embodiment, a major axis of each slot extends in a different direction from the major axes of all other slots.

In an embodiment, the reticle pod further includes a baseplate retention feature formed in the baseplate, and the flexible member includes a flexible member retention feature configured to engage with the baseplate retention feature.

DETAILED DESCRIPTION

This disclosure is directed to reticle pods, particularly reticle pods including fine as well as gross alignment features.

Figure 1:
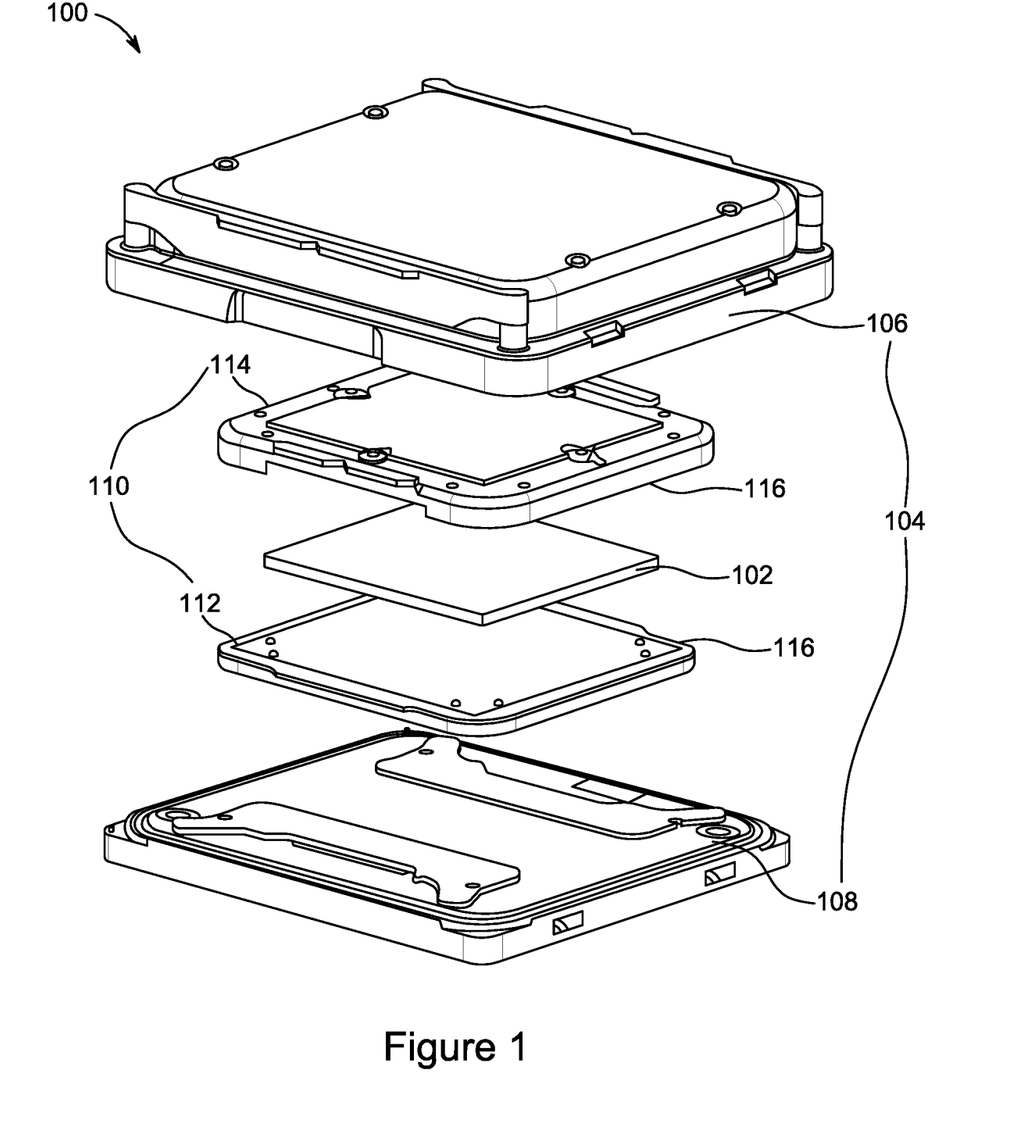
FIG. 1 shows a reticle pod according to an embodiment.

FIG. 1 shows a reticle pod according to an embodiment. Reticle pod 100 is configured to accommodate a reticle 102. The reticle pod 100 includes an outer pod 104, which includes pod dome 106 and pod door 108. The reticle pod 100 further includes inner pod 110, including baseplate 112 and cover 114. Inner pod 110 further includes gross alignment features 116.

Reticle pod 100 is a pod configured to store a reticle during transportation, handling, and processing, particularly for processing such as photolithography including, for example, Extreme Ultraviolet (EUV). The reticle is, for example, a photolithography mask for a semiconductor wafer. Reticle 102 is a reticle that can be contained within the reticle pod 100, for example for transportation, handling, or processing such as processing by photolithography such as EUV.

The reticle pod 100 includes an outer pod 104. The outer pod 104 is configured to accommodate inner pod 110. The outer pod 104 can include pod dome 106 and pod door 108. Outer pod 104 can be made of, for example, polymer materials. Pod dome 106 and pod door 108 can be configured such that they can be secured together to define an enclosed space, for example by way of a latching mechanism (not shown).

The inner pod 110 is configured to accommodate reticle 102. Inner pod 110 can be sized such that it can be placed into outer pod 104. Inner pod 110 can include a metal material, for example, being made of metal, made of metal having a coating, including one or more metal components, or the like. Inner pod 110 includes baseplate 112 and cover 114. Baseplate 112 and cover 114 are configured to be placed together to enclose the reticle 102 within the inner pod 110. The baseplate 112 and cover 114 can include features for alignment of the baseplate 112 and cover 114, as discussed below and shown in FIGS. 2-6. The features for alignment can be configured to reduce relative movement of the baseplate 112 and cover 114 with respect to one another to reduce rubbing at contact surfaces where baseplate 112 and cover 114 meet one another. The features for alignment can be in addition to gross alignment features 116 used to guide assembly of the inner pod 110. In an embodiment, the features for alignment can be provided on the gross alignment features 116, such as providing a shoulder, ledge, or other such feature on at least a portion of the gross alignment features 116.

Figure 6:
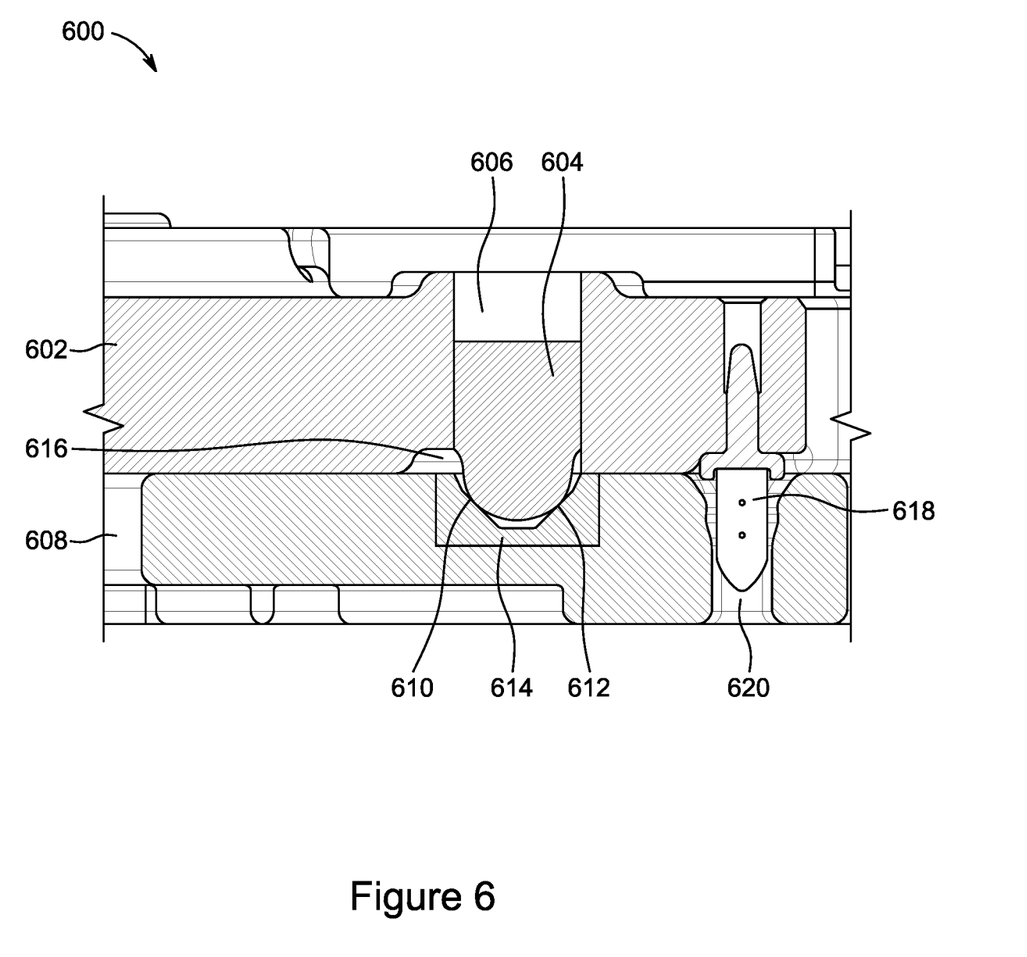
FIG. 6 shows a sectional view of an inner pod of a reticle pod according to an embodiment.

Gross alignment features 116 can be provided on one or both of baseplate 112 and cover 114 to facilitate proper assembly of inner pod 110. The gross alignment features can be any suitable feature for guiding or governing the relative alignment of baseplate 112 and cover 114 when inner pod 110 is being assembled. In the embodiment shown in FIG. 1, the gross alignment features 116 are extensions of the cover 114 at portions of the perimeter of the cover 114, projecting outwards with respect to a surface of the cover 114 facing the baseplate 112 when inner pod 110 is assembled. In the embodiment shown in FIG. 1, the gross alignment features 116 define an area in which baseplate 112 is received when inner pod 110 is assembled. In an embodiment, the gross alignment features 116 can be provided at corners of the baseplate 112 or cover 114. In an embodiment, the gross alignment features 116 can be provided at portions of the perimeter of baseplate 112 or cover 114 other than corners of the baseplate 112 or cover 114. In an embodiment, the gross alignment features 116 can include first and second gross alignment features that engage with one another when the inner pod 110 is assembled. Other gross alignment features 116 that can be used include, as a non-limiting example, pins and corresponding channels, for example as shown in FIG. 6 and described below.

Figure 2:
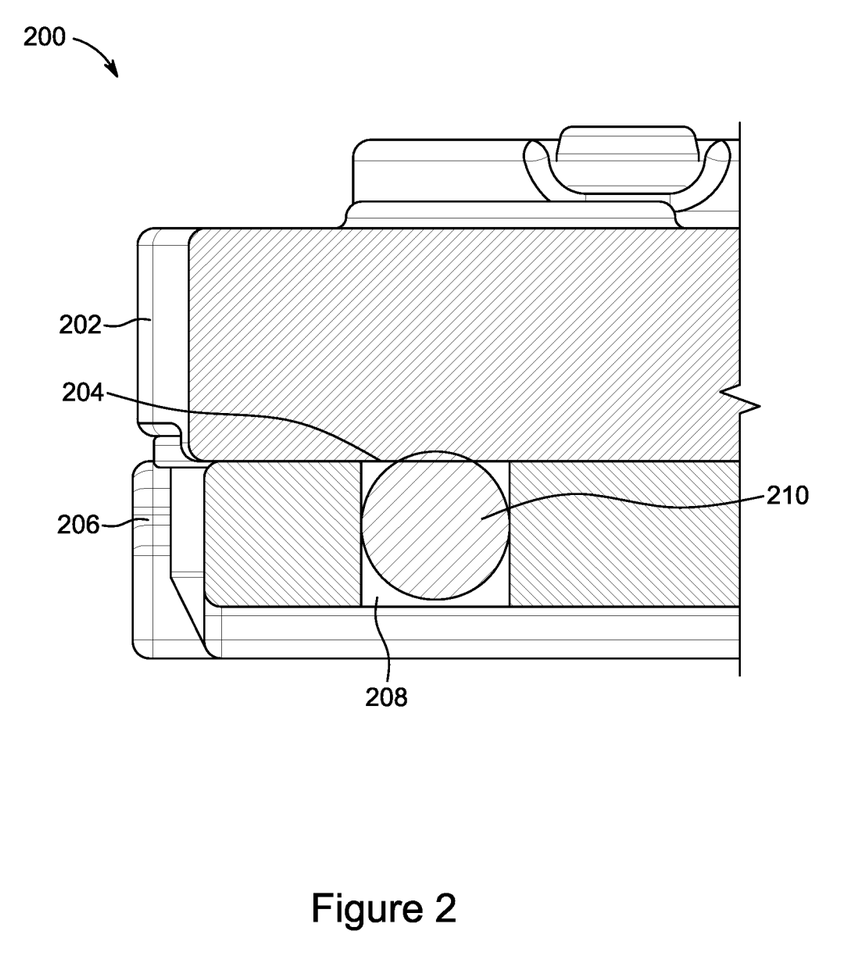
FIG. 2 shows a sectional view of an inner pod of a reticle pod according to an embodiment.

FIG. 2 shows a sectional view of an inner pod of a reticle pod according to an embodiment. Inner pod 200 includes cover 202. Cover 202 includes contact surface 204. Reticle pod 200 further includes baseplate 206. Baseplate 206 includes an alignment retention cutout 208. An elastic body 210 can be disposed in the alignment retention cutout 208.

Inner pod 200 is an inner pod of a reticle pod, such as an inner pod of reticle pod 100 shown in FIG. 1 and described above. Inner pod 200 can be sized to fit within an outer pod of the reticle pod. Inner pod 200 can further be configured to define an internal space capable of containing a reticle, such as reticle 102 described above and shown in FIG. 1.

Cover 202 is a cover of a reticle pod, such as cover 114 of reticle pod 100 as described above and shown in FIG. 1. The cover 202 includes a contact surface 204 where the cover 202 is configured to contact at least a portion of baseplate 206 and/or elastic body 210 when cover 202 and baseplate 206 are assembled to form inner pod 200. In an embodiment, contact surface 204 is the bare material of the cover 202. In an embodiment, contact surface 204 can include a coating on the material of the cover 202. In an embodiment, contact surface 204 is a flat surface of the cover 202. In an embodiment, the contact surface 204 is a substantially smooth surface. In an embodiment, the contact surface 204 can include texturing, with non-limiting examples of the texturing including grooves, roughened sections, relatively raised bumps, combinations thereof, or the like.

Baseplate 206 is a baseplate of inner pod 200. Baseplate 206 is configured to be joined with cover 202 to form inner pod 200, with inner pod 200 providing an internal space capable of containing a reticle such as reticle 102 described above and shown in FIG. 1. Baseplate 206 includes a plurality of alignment retention cutouts 208. While one representative alignment retention cutout 208 is shown in FIG. 2, a baseplate 206 can have a plurality of such retention cutouts 208. In an embodiment, the baseplate 206 includes at least three alignment retention cutouts 208. In an embodiment, the baseplate 206 includes four alignment retention cutouts 208. In an embodiment, the alignment retention cutouts can be distributed around a perimeter of baseplate 206. In an embodiment, the alignment retention cutouts can be located proximate to corners of the baseplate 206. The alignment retention cutouts 208 are each an opening formed in a surface of the baseplate 206 that faces cover 202 when the inner pod 200 is assembled. The alignment retention cutouts 208 can each have any suitable shape for accommodating the elastic body 210 such that elastic body 210 can be retained in the alignment retention cutout 208 with a portion of the elastic body 210 protruding from the surface of the baseplate 206. In an embodiment, all of the alignment retention cutouts 208 provided on baseplate 206 have the same shape. In an embodiment, at least some of the alignment retention cutouts 208 provided on the baseplate 206 can have shapes that differ from one another.

The elastic body 210 is a body made of elastic material and configured to be placed into one of the alignment retention cutouts 208 such that a portion of the elastic body 210 extends above the surface of the baseplate 206 such that it can contact cover 202 at contact surface 204 when the inner pod is assembled. The elastic body 210 can have any suitable shape based on the shape of the alignment retention cutouts 208. In an embodiment, the elastic body 210 can be a spherical shape. In embodiments, elastic bodies 210 used in an inner pod 200 can each have the same shape. In embodiments, elastic bodies 210 having differing shapes can be used in one inner pod 200. The elastic bodies 210 can include any suitable elastic or compressible material. The elastic or compressible material can be a material capable of withstanding conditions during processing of reticles contained within inner pod 200. The elastic or compressible material can be, as a non-limiting example, an elastomer such as a fluoroelastomer.

While FIG. 2 shows the contact surface 204 being provided on cover 202 and the alignment retention cutout 208 being provided on the baseplate 206, it is understood that the contact surface and the alignment retention cutout can be reversed, such that the contact surface 204 is included in baseplate 206 and alignment retention cutout 208 is provided in cover 202 with the elastic body 210 placed in alignment retention cutout 208 extending outwards from a surface of cover 202 facing baseplate 206 when the inner pod 200 is assembled.

When inner pod 200 is assembled, contact surface 204 contacts and compresses elastic bodies 210. Friction between the contact surface 204 and elastic bodies 210 can provide force resisting relative movement of the cover 202 and baseplate 206 with respect to one another where the relative movement includes a component in plane with the cover 202 or the baseplate 206. This can reduce rubbing between the cover 202 and baseplate 206 and corresponding particle generation.

The contact surface 204 and the alignment retention cutouts 208 and elastic bodies 210 can form motion limiting features that retain the cover 202 and baseplate 206. The motion limiting features can be separate and distinct from first and second gross alignment features also included in inner pod 200, such as the first and second gross alignment features shown in FIG. 6 and discussed below, such as gross alignment pins provided on one of cover 202 or baseplate 206 and corresponding gross alignment channels on the other of the cover 202 or baseplate 206, where the gross alignment channels receive the gross alignment pins.

Figure 3:
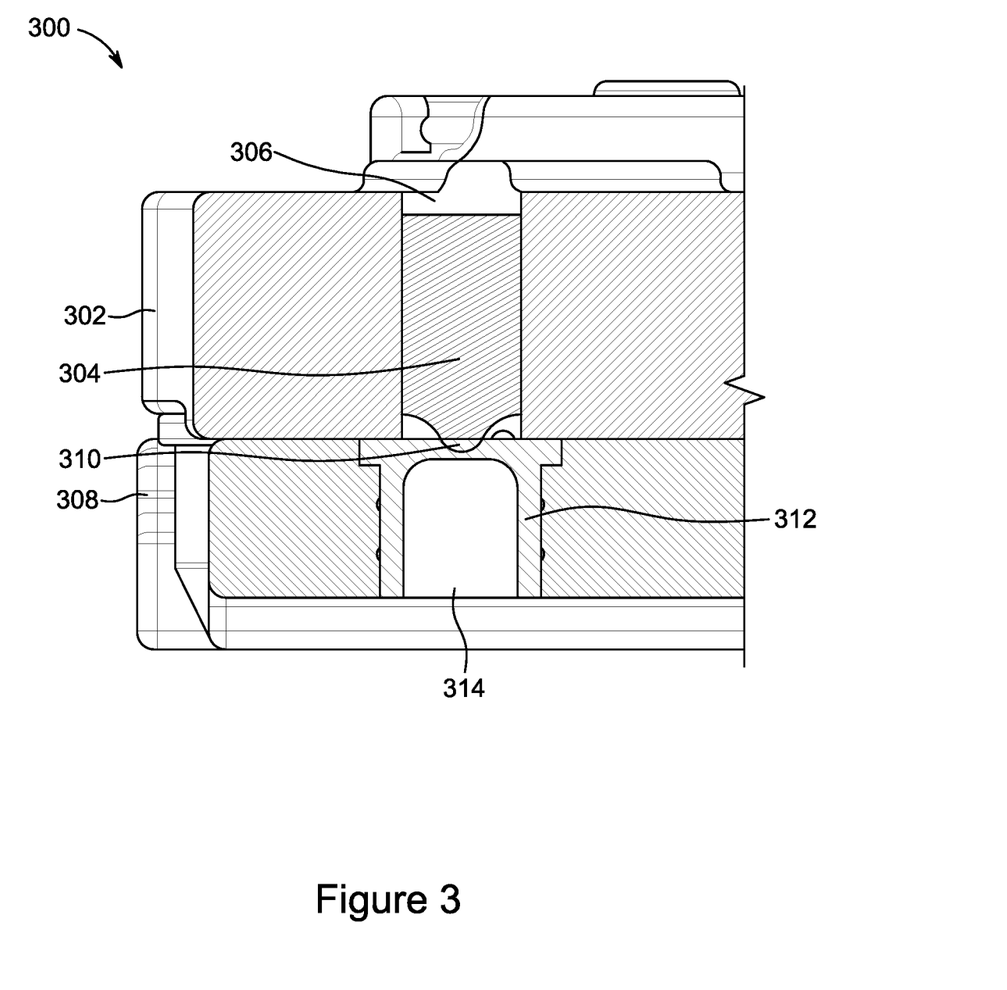
FIG. 3 shows a sectional view of an inner pod of a reticle pod according to an embodiment.

FIG. 3 shows a sectional view of an inner pod of a reticle pod according to an embodiment. Inner pod 300 includes cover 302. Cover 302 includes a mating pin 304. In the embodiment shown in FIG. 3, the mating pin 304 is disposed in a mating pin channel 306. Inner pod 300 further includes baseplate 308. Baseplate 308 includes an elastic contact surface 310. In the embodiment shown in FIG. 3, the elastic contact surface 310 is included in an elastic body 312. The elastic body 312 can be disposed in an alignment retention cutout 314 formed in the baseplate 308.

Inner pod 300 is an inner pod of a reticle pod, such as an inner pod of reticle pod 100 shown in FIG. 1 and described above. Inner pod 300 can be sized to fit within an outer pod of the reticle pod. Inner pod 300 can further be configured to define an internal space capable of containing a reticle, such as reticle 102 described above and shown in FIG. 1.

Cover 302 is a cover of a reticle pod, such as cover 114 of reticle pod 100 as described above and shown in FIG. 1. Cover 302 includes a plurality of mating pins 304. Each mating pin 304 is a pin extending from cover 302 on a side of cover 302 that faces baseplate 308 when the inner pod 300 is assembled. Each of the mating pins 304 is configured to contact an elastic contact surface 310 provided on baseplate 308. In an embodiment, mating pin 304 is formed integrally with the cover 302. In an embodiment, mating pin 304 is a separate component from cover 302 that is disposed in a mating pin channel 306 formed in the cover 302. In an embodiment, some or all of the mating pins 304 are the mating pins formed separately from the cover 302 and inserted into mating pin channels 306. In an embodiment, the mating pins 304 disposed in mating pin channels 306 can be secured by a mechanical connection between the mating pin 304 and the mating pin channel 306. In an embodiment, the mechanical connection can be a press-fit. In an embodiment, the mating pin channels 306 are through holes extending through an entire thickness of the cover 302. In an embodiment, the mating pin channels are formed to a predetermined depth from a surface of cover 302 that faces baseplate 308 when the inner pod 300 is assembled.

Baseplate 308 is a baseplate of the reticle pod. Baseplate 308 is configured such that elastic contact surfaces 310 can be provided to contact each of the mating pins 304 of cover 302 when the inner pod 300 is assembled. The elastic contact surfaces 310 can be surfaces provided on baseplate 308 that are made of an elastic material that face the cover 302 when the inner pod 300 is assembled, such that the elastic contact surfaces 310 are contacted by the mating pins 304 provided on cover 302. The elastic contact surfaces 310 can be surfaces that are raised above, flush with, or depressed with respect to a surface of baseplate 308 facing the cover 302 when the inner pod 300 is assembled. In an embodiment, at least three elastic contact surfaces 310 can be provided on baseplate 308. In an embodiment, four elastic contact surfaces 310 can be provided on baseplate 308. In an embodiment, the elastic contact surfaces 310 can be provided proximate to corners of the baseplate 308.

The elastic contact surface 310 can be provided using an elastic body 312 disposed in an alignment retention cutout 314 formed in the baseplate 308. Elastic body 312 can be a body having any suitable shape including the elastic contact surface and configured to be retained in the alignment retention cutout 314. The alignment retention cutout 314 can have any suitable shape to accept at least a portion of the elastic body 312. The elastic body 312 can be made of any suitable elastic or compressible material, such as, as a non-limiting example an elastomer such as a fluoroelastomer. The elastic body 312 is a body made of an elastic material. In an embodiment, elastic body 312 is a plug that is insertable into the alignment retention cutout 314. In an embodiment, the elastic body 312 includes a lip that has a perimeter greater than a perimeter of the alignment retention cutout 314. In an embodiment, the elastic body 312 includes an insertion portion having a shape corresponding to the alignment retention cutout 314, such that a press-fit can be formed between the elastic body 312 and baseplate 308. In an embodiment, elastic body is solid. In an embodiment, elastic body 312 includes a hollow section opposite the portion of the elastic body 312 that is contacted by the mating pin 304.

When inner pod 300 is assembled, the mating pins 304 each contact a corresponding one of the elastic contact surfaces 310. The mating pins 304 press into the elastic contact surfaces 310, with this contact restricting relative motion of cover 302 and baseplate 308 where there is a component in plane with the cover 302 or the baseplate 308. The mating pins 304 and elastic contact surfaces 310 can form motion limiting features additional to and distinct from gross alignment features included in cover 302 and/or baseplate 308, such as motion limiting pins and channels. The motion limiting features can limit lateral motion or translational motion of the baseplate 308 and cover 302 relative to one another. Examples of such gross alignment features are, for example, discussed below and shown in FIG. 6. When inner pod 300 is assembled, the cover 302 and baseplate 308 can be contact with one another. In embodiments, variance in the surfaces such as manufacturing tolerances can cause some areas to be out of contact in the regions of cover 302 and baseplate 308 that correspond to one another.

While the embodiment shown in FIG. 3 provides the elastic contact surfaces 310 on the baseplate 308 and the mating pins 304 on the cover 302, it is understood that these features can be reversed such that the mating pins 304 are provided on baseplate 308 and the elastic contact surfaces are provided on cover 302, with corresponding changes in the positions of the mating pin channels 306, elastic bodies 312, and alignment retention cutouts 314.

Figure 4:
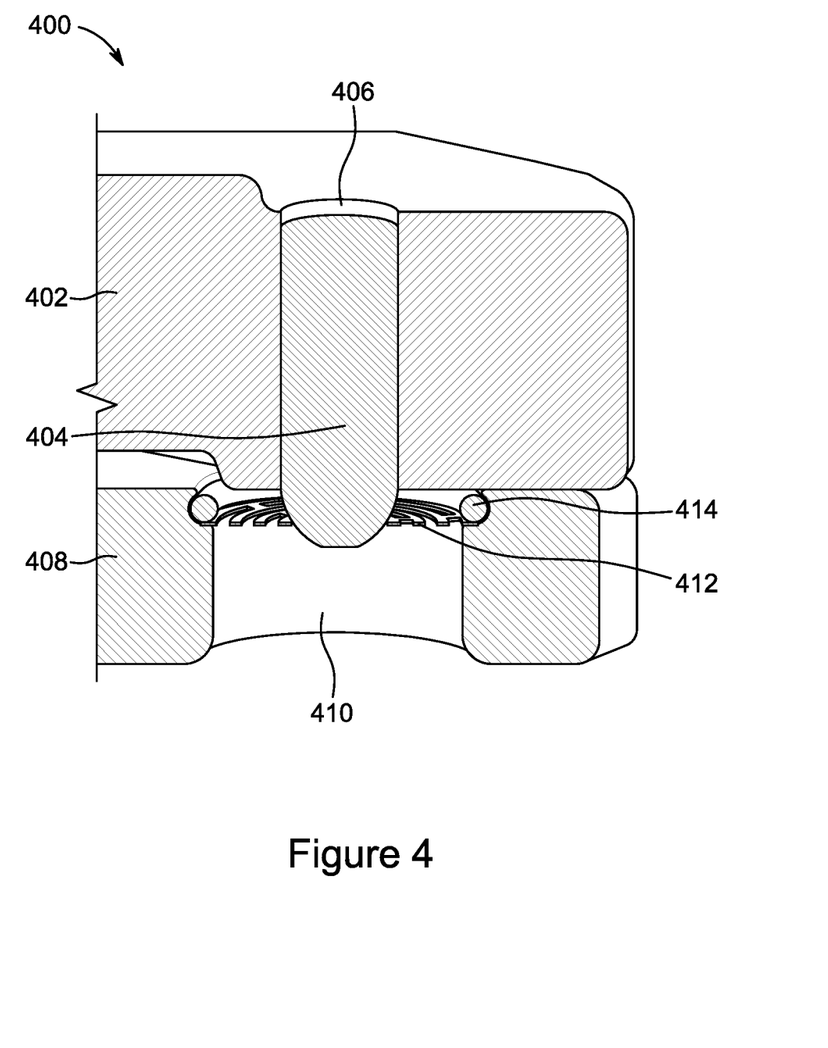
FIG. 4 shows a sectional view of an inner pod of a reticle pod according to an embodiment.

FIG. 4 shows a sectional view of an inner pod of a reticle pod according to an embodiment. Inner pod 400 includes cover 402. Cover 402 includes a pin 404. In the embodiment shown in FIG. 4, pin 404 can be disposed in a pin channel 406 formed in cover 402. Inner pod 400 further includes baseplate 408. The baseplate 408 can include diaphragm openings 410. A diaphragm 412 can be provided in each of the diaphragm openings 410. A retention ring 414 can be provided to secure each diaphragm 412 in its respective diaphragm opening 410.

Inner pod 400 is an inner pod of a reticle pod, such as an inner pod of reticle pod 100 shown in FIG. 1 and described above. Inner pod 400 can be sized to fit within an outer pod of the reticle pod. Inner pod 400 can further be configured to define an internal space capable of containing a reticle, such as reticle 102 described above and shown in FIG. 1.

Cover 402 is a cover included in inner pod 400. Cover 402 includes a plurality of pins 404 extending from a surface of cover 402 that faces baseplate 408 when the inner pod 400 is assembled. The pins 404 can have a tip having a taper or curve, such that the pins can be inserted to a predetermined depth when received in an opening provided in diaphragm 412. In an embodiment, the pins 404 can be formed integrally with the cover 402. In an embodiment, the pins 404 are each disposed in a pin channel 406 formed in the cover 402. The pins 404 can be secured in pin channel 406 by any suitable connection, such as, as a non-limiting example, press-fit between each pin 404 and its respective pin channel 406. In an embodiment, three or more pins 404 can be provided on cover 402. In an embodiment, four pins 404 can be provided on cover 402. In an embodiment, the pins 404 can be disposed proximate to corners of the cover 402. In an embodiment, the pin channels 406 are openings recessed to a predetermined depth from the surface of cover 402 that faces the baseplate 408 when inner pod 400 is assembled. In an embodiment, the pin channels 406 can be through holes extending through an entire thickness of cover 402.

Baseplate 408 is the baseplate included in inner pod 400. Baseplate 408 includes a plurality of diaphragm openings 410 formed in positions corresponding to the positions of the pins 404 on cover 402, such that the pins 404 can be received in diaphragms 412 when the cover 402 and baseplate 408 are assembled to form inner pod 400. The diaphragm openings 410 are openings in the baseplate 408 that are each configured to contain a diaphragm 412. In an embodiment, diaphragm openings 410 include a step, shoulder, or ledge that is recessed from the surface of baseplate 408 that faces the cover 402 when the inner pod is assembled. In an embodiment, a portion of the diaphragm opening 410 is a through hole extending through an entire thickness of baseplate 408. In an embodiment, the diaphragm opening 410 does not extent completely through the thickness of baseplate 408.

Figure 5:
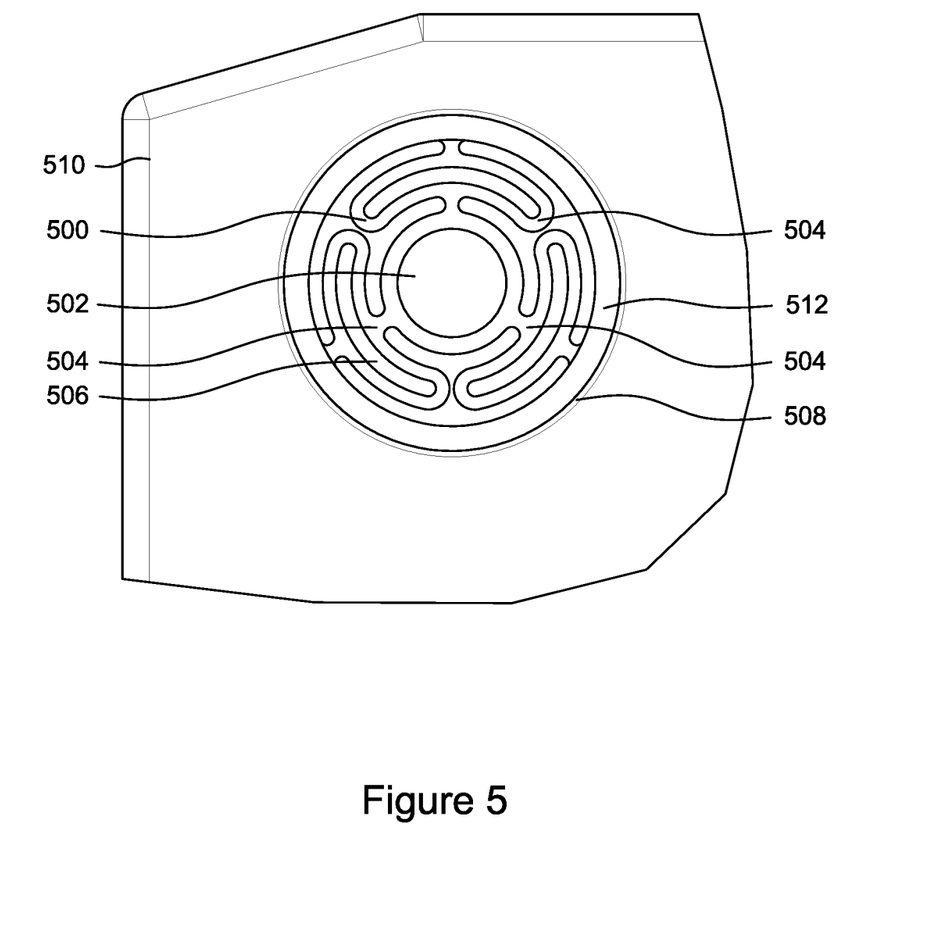
FIG. 5 shows a plan view of a diaphragm in a baseplate of a reticle pod according to an embodiment.

A diaphragm 412 is disposed in each of the diaphragm openings 410. Diaphragm 412 is configured to receive an end of one of the pins 404 when the cover 402 is assembled to the baseplate 408. The diaphragm 412 is configured such that the portion receiving the end of the pin 404 can be displaced in a direction substantially perpendicular to the plane of diaphragm 412. The diaphragm 412 can provide substantially greater resistance to movement of the portion receiving the end of the pin 404 in directions parallel to the plane of diaphragm 412. The diaphragm 412 can be made of any suitable material such as, for example, steel materials. An example of a diaphragm 412 is shown in FIG. 5 and described in further detail below.

Retention ring 414 is configured to retain the diaphragm 412 in diaphragm opening 410. The retention ring 414 can be, for example, a snap ring. Retention ring 414 can be made of any suitable materials including polymer or metal materials. The retention ring 414 can hold diaphragm 412 against steps, shoulders, or ledges provided in the diaphragm opening 410. Retention ring 414 can have any suitable shape for engaging with the diaphragm opening 410 and retaining diaphragm 412 in position within the diaphragm opening 410. In an embodiment, retention ring 414 can have a shape corresponding to the shape of the diaphragm opening 410.

When inner pod 400 is assembled by placing cover 402 and baseplate 408 together, the tapered ends of the pins 404 each engage with one of the diaphragms 412. The portion of the diaphragm 412 receiving the end of a pin 404 can move in a direction perpendicular to the diaphragm 412 such that the inner pod 400 can be assembled with little resistance. The engagement of diaphragm 412 and pin 404 can restrict relative movement of cover 402 and baseplate 408 that is in plane with the cover 402 or baseplate 408 due to the properties of the diaphragm 412 and differences in its resistance to deformation in plane versus deformation perpendicular to the plane of the diaphragm 412. Accordingly, relative movement of cover 402 and baseplate 408 having a component in plane with the cover 402 or baseplate 408 is restricted, limiting rubbing of cover 402 against baseplate 408 when the inner pod 400 is assembled. The pins 404 and diaphragms 412 can form motion limiting features that are separate and distinct from first and second gross alignment features formed in the cover 402 and baseplate 408, such as the gross alignment features shown in FIG. 6 and described below.

While FIG. 4 shows the pins 404 extending from the cover 402 and the diaphragm 412 disposed in a diaphragm opening 410 formed in the baseplate 408, it is understood that these features can be reversed such that the pins 404 instead extend from baseplate 408 and the diaphragm 412 is disposed in a diaphragm opening 410 that is instead formed in cover 402, with corresponding changes to the positions of other features such as the pin channels 406 and the retention rings 414.

FIG. 5 shows a plan view of a diaphragm in a baseplate of a reticle pod according to an embodiment. Diaphragm 500 includes a central opening ring 502, a plurality of spring beams 504, which can include spring beam opening 506. The diaphragm 500 is installed into diaphragm opening 508 formed in baseplate 510. The diaphragm 500 can be secured in diaphragm opening 508 by a retention ring 512.

Diaphragm 500 is an embodiment of diaphragm 412 as discussed above. Diaphragm 500 is configured to be deformable in a direction perpendicular to the plane of the diaphragm 500, and to provide substantially greater resistance to deformation in directions parallel to the plane of the diaphragm 500. The diaphragm 500 includes a central opening ring 502 configured to receive a tip of a pin, such as pin 404 described above and shown in FIG. 4. The central opening ring 502 can be configured to engage the tip of the pin along a tapered or curved portion. The central opening ring 502 can have any suitable shape for receiving and engaging with the pin, such as the circular opening shown in FIG. 5. Central opening ring 502 is supported by spring beams 504. The spring beams 504 can be radially distributed about the central opening ring 502. The spring beams 504 can have any suitable shape for allowing deformation that moves central opening ring 502 perpendicular to the plane of diaphragm 500. In an embodiment, spring beams 504 each include their own respective spring beam opening 506. The spring beams can each connect to a perimeter of the diaphragm 500 (not shown; covered by the retention ring 512).

Diaphragm opening 508 is an opening formed in baseplate 510. The diaphragm opening 508 can be any suitable shape for accommodating diaphragm 500. In an embodiment, diaphragm opening 508 includes a step, shoulder, or ledge recessed from a surface of the reticle pod 510 and sized such that the diaphragm 500 can rest on the step or ledge. In an embodiment, the diaphragm opening 508 is a recess from the surface of reticle pod 510 having a predetermined depth. In an embodiment, the diaphragm opening 508 includes at least a portion drilled through an entire thickness of the baseplate 510.

Retention ring 512 is configured to retain the diaphragm 500 within the diaphragm opening 508. Retention ring 512 can have any suitable shape to correspond to the perimeter of diaphragm 500 and fit within at least a portion of the diaphragm opening 508. In an embodiment, the retention ring 512 is a snap ring. In an embodiment, retention ring 512 can press the diaphragm against a step, shoulder, or ledge formed in diaphragm opening 508 to secured the position of diaphragm 500 in place.

FIG. 6 shows a sectional view of an inner pod of a reticle pod according to an embodiment. Reticle pod 600 includes cover 602. Cover 602 includes motion limiting pin 604. The motion limiting pin 604 can be disposed in a motion limiting channel 606 provided in cover 602. Reticle pod 600 further includes a baseplate 608. Baseplate 608 includes a motion limiting cup 610. In the embodiment shown in FIG. 6, the motion limiting cup 610 is provided on an insert 612, with the insert provided in recess 614 formed in the baseplate 608. A supplemental contact surface 616 can also be provided. In the embodiment shown in FIG. 6, a first gross alignment feature 618 and a second gross alignment feature 620 can also be seen.

Inner pod 600 is an inner pod of a reticle pod, such as an inner pod of reticle pod 100 shown in FIG. 1 and described above. Inner pod 600 can be sized to fit within an outer pod of the reticle pod. Inner pod 600 can further be configured to define an internal space capable of containing a reticle, such as reticle 102 described above and shown in FIG. 1.

Cover 602 is a cover included in inner pod 600. Cover 602 includes motion limiting pins 604. In an embodiment, cover 602 includes at least 3 motion limiting pins 604. In an embodiment, cover 602 includes 4 motion limiting pins 604. In an embodiment, cover 602 includes a motion limiting pin 604 proximate to each corner of the cover 602. Motion limiting pins 604 project from a surface of cover 602 that faces baseplate 608 when inner pod 600 is assembled. Motion limiting pins 604 can each have a tapered or curved tip. In an embodiment, motion limiting pin 604 can be formed integrally with cover 602. In an embodiment, motion limiting pin 604 can be disposed in motion limiting channel 606. The motion limiting pin 604 can be retained in motion limiting channel 606 by any suitable method. In an embodiment, motion limiting pin 604 is press-fit within motion limiting channel 606. In an embodiment, motion limiting channel 606 is a recessed from the surface of cover 602. In an embodiment, motion limiting channel 606 is a through hole extending through an entire thickness of the cover 602.

Baseplate 608 is a baseplate of inner pod 600. Baseplate 608 includes motion limiting cups 610 each configured to receive one of the motion limiting pins 604 provided on the cover 602. The motion limiting cups 610 can be positioned such that their relative positions correspond to the positions of the motion limiting pins. In an embodiment, the motion limiting cups are featured formed in the baseplate 608 itself, for example being shaped cutouts from the baseplate 608. In an embodiment, motion limiting cups 610 are each configured to provide a plurality of discrete points of contact with the motion limiting pin 604 when the motion limiting pin 604 is received in the motion limiting cup 610 when the inner pod 600 is assembled. In an embodiment, the motion limiting cups 610 can include a plurality of sloping portions configured to provide the points of contact with the corresponding motion limiting pin 604. In an embodiment, the motion limiting cups 610 can each have a rectangular shape at the surface of baseplate 608. In an embodiment, the motion limiting cups 610 are formed in inserts 612 that are configured to be placed into recesses 614 formed in baseplate 608. The recesses 614 are configured to receive and retain the inserts 612. In an embodiment, the recesses 614 retain the inserts by way of a press-fit. The inserts 612 can be made of any suitable material, including metals, coated metals, polymer materials, and the like, so long as the inserts 612 can restrict movement of the motion limiting pins and withstand any processing that inner pod 600 will be used in. The recesses 614 and inserts 612 can have generally rectangular shapes. In an embodiment, the major axis of these rectangular shapes can be angled with respect to the sides of the cover 602 or baseplate 608 such that the major axes of the recesses 614 and inserts 612 are not parallel with any of the sides of the cover 602 or baseplate 608.

Supplemental contact surface 616 can be provided on baseplate 608 to provide further contact with the motion limiting pins 604. In an embodiment, supplemental contact surface 616 extends above a surface of baseplate 608. In an embodiment, supplemental contact surface 616 can be integral with baseplate 608. In an embodiment, supplemental contact surfaces 616 are included in the insert 612. Supplemental contact surface 616 can each be configured to contact a side of one of the motion limiting pins 604.

FIG. 6 further shows gross alignment features included in inner pod 600. While not visible in the particular views of FIGS. 1-4, it is understood that inner pods 110, 200, 300, and 400 also include first and second gross alignment features such as the first and second gross alignment features 618, 620 visible in FIG. 6. First and second gross alignment features 618 and 620 are configured to interface with one another to guide the assembly of the inner pod 600 and to assist in securing the cover 602 to the baseplate 608. In an embodiment, the first and second gross alignment features 618, 620 engage with one another prior to the engagement of motion limiting features such as the motion limiting pins 604 and the motion limiting cup 610. In an embodiment, the first and second gross alignment features 618, 620 engage with one another subsequent to the engagement of motion limiting features such as the motion limiting pins 604 and the motion limiting cup 610. In an embodiment, the first and second gross alignment features 618, 620 engage with one another at the same time as the engagement of motion limiting features such as the motion limiting pins 604 and the motion limiting cup 610.

First gross alignment feature 618 can be a projection, for example a projection extending from cover 602. The first gross alignment feature 618 can be formed integrally with cover 602, or as shown in FIG. 6, can be a pin disposed in and extending from a channel formed in the cover 602.

Second gross alignment feature 620 can be a channel configured to receive the first gross alignment feature 618. The second gross alignment feature can be configured such that there is more space than necessary to receive first gross alignment feature 618 such that the engagement of first and second gross alignment features 620 allows for relative movement of cover 602 and baseplate 608 that is in plane with the cover 602 or the baseplate 608. First and second gross alignment features 618, 620 can optionally be reversed such that the first gross alignment feature 618 projects from the baseplate 608 and the second gross alignment feature 620 is formed in the cover 602. The interface of the first gross alignment features 618 and the corresponding second gross alignment features 620 can be such that up to 0.2 millimeters (mm) of relative movement in plane with the cover or baseplate may be allowed before the interface of the first and second gross alignment features 618, 620 prohibits further movement.

When inner pod 600 is assembled by joining cover 602 to baseplate 608, each of the motion limiting pins 604 interfaces with each of multiple contact surfaces provided by motion limiting cup 610 and supplemental contact surface 616. The engagement of each of the motion limiting pins 604 with those multiple contact surfaces can restrict movement of the cover 602 relative to baseplate 608 such that relative movement in plane with cover 602 or baseplate 608 is restricted.

While the inner pod 600 shown in FIG. 6 includes the motion limiting pin 604 in the cover 602 and the motion limiting cup 610 is provided on baseplate 608, it is understood that these features can be reversed such that the motion limiting pin 604 instead projects from baseplate 608 and the motion limiting cup is provided on cover 602, with any corresponding features such as motion limiting channel 606, recess 614, and supplemental contact surface 616 being correspondingly reversed from the cover 602 to the baseplate 608 and vice versa.

While the motion limiting features are shown individually in inner pods 200, 300, 400, and 600 in FIGS. 2, 3, 4, and 6, respectively, it is understood that the individual motion limiting features shown in those Figures can be combined, for example including the corresponding motion limiting features from two or more of inner pods 200, 300, 400, and/or 600 in the cover and baseplate of another inner pod.

Figure 7:
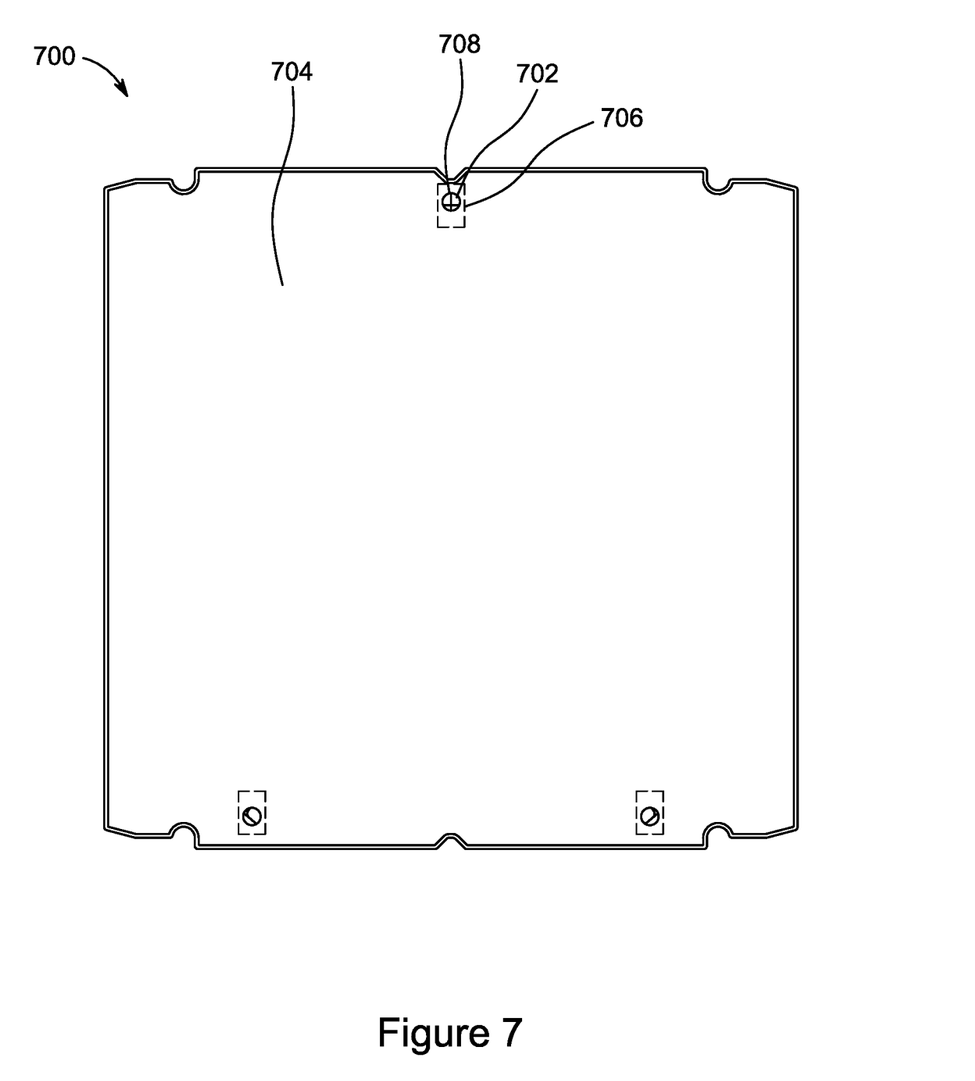
FIG. 7 shows a baseplate of an inner pod of a reticle pod according to an embodiment.

FIG. 7 shows a baseplate of an inner pod of a reticle pod according to an embodiment. Baseplate 700 includes a plurality of slots 702 formed on surface 704 facing a cover of the inner pod. The slots 702 are each backed by a flexible member 706 provided on an opposite side of the baseplate 700 and having a contact surface 708.

Slots 702 are formed in the baseplate 700. Slots 702 extend through the body of baseplate 700. Slots 702 are sized to receive pins provided on a cover used with the baseplate 700 to form an inner pod, such as cover 802 having pins 804 as described below and shown in FIG. 8. Slots 702 are positioned such that at least a portion of each slot extends out of an area where a reticle is positioned when the reticle is stored in the inner pod including baseplate 700. Each of the slots 702 has a major axis. In an embodiment, the baseplate 700 includes three slots 702. Slots 702 can have any suitable two-dimension shape, for example a circular hole, a rectangle, an oval, a stadium or capsule shape, or the like. In an embodiment, slots 702 include straight sides perpendicular to a plane of the baseplate 700. In an embodiment, slots 702 have sides angled with respect to the plane of the baseplate such that the slots 702 taper as they extend through baseplate 700. The slots 702 can include a lead-in to facilitate insertion of pins into each of the slots 702. In an embodiment, the slots 702 include a bevel and/or radiusing on a side of slots 702 facing the cover used with baseplate 702. In an embodiment, the major axis of each of the slots 702 extends in a different direction. In an embodiment, the slots 702 are positioned such that the slots 702 are arranged mirrored to kinematic coupling grooves formed in a side of the baseplate 700 opposing surface 700. In an embodiment, the baseplate 700 includes four or more slots 702. In an embodiment, the major axes of at least two of the slots 702 are collinear or parallel. In an embodiment, the major axes of the slots 702 provided on baseplate 700 intersect at a center of the baseplate 700.

Flexible members 706 are provided such that pins inserted into the slots 702 each contact a flexible member 706 after passing through the body of baseplate 700 through which slots 702 extend. The flexible members 706 can include a resilient polymer material, a metal spring arm, or any other suitable flexible material allowing a contact surface 708 of the flexible member to be deflected when a pin contacts the contact surface 708. The contact surface 708 is a portion of flexible member 706 configured to engage with a pin of a cover to restrict movement of the pin along the extending direction of the slot 702 that the flexible member backs, thus limiting movement of the cover including said pin. The flexible member 706 can deflect such that the contact surface 708 engages with the pin at a taper, an angled end, or any other such other suitable surface formed on the pin. The flexible member 706 can have a flexibility selected such that the deflection of contact surface 708 is controlled to match a depth to which the pin protrudes through slot 702 when the inner pod including baseplate 700 is assembled.

Figure 8:
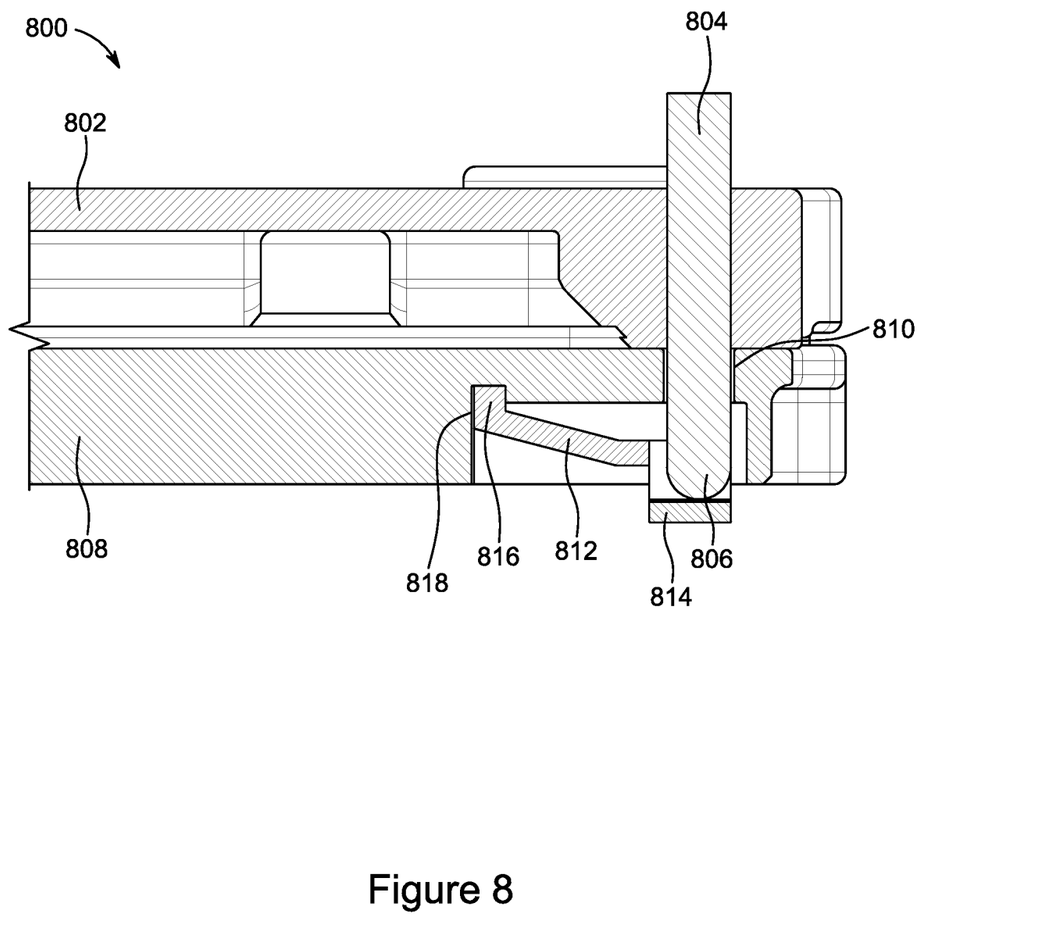
FIG. 8 shows a sectional view of an inner pod of a reticle pod according to an embodiment.

FIG. 8 shows a sectional view of an inner pod of a reticle pod according to an embodiment. Inner pod 800 includes cover 802 including pins 804. The pins 804 include an end 806. Inner pod 800 further includes baseplate 808 including slots 810. A flexible member 812 is provided at each of the slots 810. Each flexible member includes a contact surface 814 and a flexible member retention feature 816. The flexible member retention feature 816 is configured to engage with a baseplate retention feature 818 formed in the baseplate 808.

Cover 802 is a cover of a reticle pod, configured to, when combined with baseplate 808, form inner pod 800 including an internal space configured to accommodate a reticle. The cover 802 includes pins 804. Pins 804 can be positioned such that the pins 804 do not extend through the inner pod at positions where the reticle may be present when the reticle is stored within inner pod 800. The pins 804 extend a length such that the pins 804 can extend through the slots 810 to contact the contact surfaces 814 when the inner pod 800 is assembled. One or more pins 804 can be provided for each of the slots 810 included in the corresponding baseplate 808, such as three pins 804 being provided in a cover 802 to be used with baseplate 700 having three slots 702 as described above and shown in FIG. 7.

Each of pins 804 includes end 806. End 806 can be shaped to engage with the contact surface 814 provided by flexible member 812 at the respective slot 810. In an embodiment, end 806 is tapered. In an embodiment, end 806 includes an angled surface that is not parallel or perpendicular to a direction of extension of the pin 804. In an embodiment, end 806 comes to a point. When end 806 engages with contact surface 814, movement of the pin 804 along slot 810 can be restricted by the contact of end 806 or a portion thereof with the contact surface 814.

Baseplate 808 is a baseplate of the inner pod 800. Baseplate 808 includes slots 810 formed in the baseplate 808. Slots 810 extend through the thickness of baseplate 808. Each slot 810 is configured to receive a corresponding pin 804 provided on the cover 802. The slots can be included in any suitable number and arrangement, as described above for slots 702 shown in FIG. 7. A flexible member 812 is provided on a side of baseplate 808 opposite the cover 802 when the inner pod 800 is assembled. The flexible member 812 can be shaped to cover at least a portion of the opening formed by the slot 810. Flexible member 812 covers an opening formed by slot 810 on the side opposite cover 802. Flexible member 812 provides a contact surface 814 configured to engage with pin 804 so as to restrict movement of the cover 802 along a direction in which slot 810 extends. The flexible member 812 is configured such that contact surface 814 can be deflected by contact with the pin 804. The contact surface 814 and deflection thereof can be configured such that the contact surface engages with features of end 806 of the pin 804, such as an angled surface, a taper, or the like to restrict translational movement of the pin 804 along slot 810 and thus retain cover 802 at a particular position. The retention of cover 802 by way of the engagement of pin 804 with slot 810 and contact surface 814 can thus restrict translational motion of cover 802 relative to baseplate 808 such that alignment is maintained and sliding and particle generation at contacting surfaces of cover 802 and baseplate 808 are reduced.

Flexible member 812 includes flexible member retention feature 816 and baseplate 808 includes baseplate retention feature 818. Flexible member retention feature 816 and baseplate retention feature 818 can be any suitable corresponding features for securing the flexible member 812 to baseplate 808. In an embodiment, the baseplate retention feature 818 can be a groove or hole configured to receive a projection provided on flexible member 812 as the flexible member retention feature 816. In an embodiment, the flexible member retention feature can be press-fit into the baseplate retention feature 818. In an embodiment, the groove or hole can receive an undercut configured to receive a flange, tab, or other such projection from the flexible member retention feature 816. In an embodiment, an adhesive can be provided to secure the flexible member retention feature 816 to baseplate retention feature 818.

ASPECTS

It is understood that any of the following aspects may be combined with any other of the following aspects.

Aspect 1. A reticle pod, comprising:
an inner pod including a baseplate and a cover, wherein:
the inner pod includes at least one gross alignment feature and a plurality of motion limiting features, each of the plurality of motion limiting features including:
an alignment retention cutout formed in one of the cover or the baseplate and an elastic bodies disposed in the alignment retention cutout, wherein the elastic body is configured to contact both of the baseplate and the cover when the inner pod is assembled, and
wherein the plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

Aspect 2. A reticle pod, comprising:
an inner pod including a baseplate and a cover, wherein:
the inner pod includes at least one gross alignment feature and a plurality of motion limiting features, each of the plurality of motion limiting features including:
a mating pin extending from one of the cover or the baseplate, and an elastic contact surface provided on the other of the cover or the baseplate, wherein the mating pin is configured to contact the elastic contact surfaces when the inner pod is assembled, and
wherein the plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

Aspect 3. The reticle pod according to aspect 2, wherein the elastic contact surface is provided on an elastic body, the elastic body including a hollow portion opposite a surface where the mating pin is configured to contact said elastic contact surface.

Aspect 4. The reticle pod according to any of aspects 2-3, wherein each of the mating pins is disposed in a mating pin channel, each mating pin channel formed in the one of the cover or the baseplate.

Aspect 5. A reticle pod, comprising:
an inner pod including a baseplate and a cover, wherein:
the inner pod includes at least one gross alignment feature and a plurality of motion limiting features, each of the plurality of motion limiting features including:
a diaphragm disposed in one of the cover or the baseplate;
a pin extending from the other of the cover or the baseplate, the pin configured to contact the diaphragm when the inner pod is assembled;
wherein the diaphragm has a resistance to deformation in a direction in plane with the cover or the baseplate that is greater than a resistance to deformation in a direction perpendicular to a plane of the cover or the baseplate, and
each of the pins have a taper at an end configured to contact one of the plurality of diaphragms,
wherein the plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

Aspect 6. The reticle pod according to aspect 5, wherein each of the motion limiting features includes an alignment retention cutout configured to accommodate the diaphragm and a retention ring configured to retain the diaphragm in the alignment retention cutout.

Aspect 7. The reticle pod according to any of aspects 5-6, wherein the pin is disposed in a pin channel formed in the one of the cover or the baseplate.

Aspect 8. A reticle pod, comprising:
an inner pod including a baseplate and a cover, wherein:
the inner pod includes at least one gross alignment feature and a plurality of motion limiting features, each of the plurality of motion limiting features including:
a motion limiting pin extending from one of the cover or the baseplate; and a motion limiting cup provided in the other of the cover or the baseplate,
wherein the motion limiting pin is configured to be contacted by a plurality of distinct surfaces of the motion limiting cup when the inner pod is assembled,
wherein the plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

Aspect 9. The reticle pod according to aspect 8, wherein the motion limiting cup is formed directly in one of the cover or the baseplate.

Aspect 10. The reticle pod according to any of aspects 8-9, wherein the motion limiting cup is formed in an insert, the insert configured to be received in a recess formed in one of the cover or the baseplate.

Aspect 11. A method of securing an inner pod of a reticle pod, comprising:
engaging one or more gross alignment features included on one of a cover and a baseplate with the other of the cover and the baseplate;
engaging each of a plurality of motion limiting features provided on one of the cover or the baseplate with the other of the cover or the baseplate, wherein the plurality of motion limiting features includes a plurality of alignment retention cutouts and a plurality of elastic bodies, wherein each elastic body disposed in one of the alignment retention cutouts, and each of the plurality of elastic bodies is configured to contact both of the baseplate and the cover when the inner pod is assembled,
wherein when a force having a component in plane with the cover or the baseplate acts on the inner pod, the engagement of the motion limiting features provides resistance to the component of the force before the engagement of the cover gross alignment features with the baseplate gross alignment features provide resistance to the component of the force.

Aspect 12. The method according to aspect 11, wherein a reticle is located within the inner pod, the method further comprising: placing the inner pod within an outer pod of the reticle pod and securing the outer pod to enclose the reticle pod, and
subjecting the inner pod to an extreme ultraviolet process.

Aspect 13. A method of securing an inner pod of a reticle pod, comprising:
engaging one or more gross alignment features included on one of a cover and a baseplate with the other of the cover and the baseplate;
engaging each of a plurality of motion limiting features provided on one of the cover or the baseplate with the other of the cover or the baseplate, wherein the plurality of motion limiting features includes a plurality of mating pins extending from one of the cover or the baseplate, and a plurality of elastic contact surfaces on the other of the cover or the baseplate, wherein each of the plurality of mating pins is configured to contact one of the elastic contact surfaces,
wherein when a force having a component in plane with the cover or the baseplate acts on the inner pod, the engagement of the motion limiting features provides resistance to the component of the force before the engagement of the cover gross alignment features with the baseplate gross alignment features provide resistance to the component of the force.

Aspect 14. The method according to aspect 13, wherein a reticle is located within the inner pod, the method further comprising:
placing the inner pod within an outer pod of the reticle pod and securing the outer pod to enclose the reticle pod, and subjecting the inner pod to an extreme ultraviolet process.

Aspect 15. A method of securing an inner pod of a reticle pod, comprising:
engaging one or more gross alignment features included on one of a cover and a baseplate with the other of the cover and the baseplate;
engaging each of a plurality of motion limiting features provided on one of the cover or the baseplate with the other of the cover or the baseplate, wherein the plurality of motion limiting features includes
a plurality of diaphragms, each of the plurality of diaphragms disposed in one of the cover or the baseplate;
a plurality of pins extending from the other of the cover or the baseplate, each of the plurality of pins configured to contact one of the plurality of diaphragms when the inner pod is assembled;
wherein each of the plurality of diaphragms has a resistance to deformation in a direction in plane with the cover or the baseplate that is greater than a resistance to deformation in a direction perpendicular to a plane of the cover or the baseplate;
each of the pins have a taper at an end configured to contact one of the plurality of diaphragms,
wherein when a force having a component in plane with the cover or the baseplate acts on the inner pod, the engagement of the motion limiting features provides resistance to the component of the force before the engagement of the cover gross alignment features with the baseplate gross alignment features provide resistance to the component of the force.

Aspect 16. The method of according to aspect 15, wherein a reticle is located within the inner pod, the method further comprising:
placing the inner pod within an outer pod of the reticle pod and securing the outer pod to enclose the reticle pod, and subjecting the inner pod to an extreme ultraviolet process.

Aspect 17. A method of securing an inner pod of a reticle pod, comprising:
engaging one or more gross alignment features included on one of a cover and a baseplate with the other of the cover and the baseplate;
engaging each of a plurality of motion limiting features provided on one of the cover or the baseplate with the other of the cover or the baseplate, wherein the plurality of motion limiting features includes:
a plurality of motion limiting pins extending from one of the cover or the baseplate; and
a plurality of motion limiting cups provided in the other of the cover or the baseplate,
wherein each of the plurality of motion limiting pins is configured to be contacted by a plurality of distinct surfaces of one of the plurality of motion limiting cups when the inner pod is assembled,
wherein when a force having a component in plane with the cover or the baseplate acts on the inner pod, the engagement of the motion limiting features provides resistance to the component of the force before the engagement of the cover gross alignment features with the baseplate gross alignment features provide resistance to the component of the force.

Aspect 18. The method according to aspect 17, wherein a reticle is located within the inner pod, the method further comprising:

placing the inner pod within an outer pod of the reticle pod and securing the outer pod to enclose the reticle pod, and subjecting the inner pod to an extreme ultraviolet process.

Aspect 19. A reticle pod, comprising:
an inner pod including a baseplate and a cover, wherein:
the inner pod includes at least one gross alignment feature and a plurality of motion limiting features, each of the plurality of motion limiting features including:
a pin extending from the cover on a side of the cover configured to face the baseplate when the inner pod is assembled;
a slot formed in the baseplate, the slot configured to receive the pin; and
a flexible member configured to cover the slot on a side of the baseplate opposite the cover when the inner pod is assembled, the flexible member including a contact surface configured to be contacted by an end of the pin, the flexible member configured such that the contact surface can be deflected by contact with the pin.

Aspect 20. The reticle pod according to aspect 19, wherein the inner pod includes at least three of the motion limiting features.

Aspect 21. The reticle pod according to aspect 20, wherein a major axis of each slot extends in a different direction from the major axes of all other slots.

Aspect 22. The reticle pod according to aspect 19, further comprising a baseplate retention feature formed in the baseplate, wherein the flexible member includes a flexible member retention feature configured to engage with the baseplate retention feature.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A reticle pod, comprising:
an inner pod including a baseplate and a cover, wherein:
the inner pod includes at least one gross alignment feature and a plurality of motion limiting features, each of the plurality of motion limiting features including:
a mating pin extending from one of the cover or the baseplate, and an elastic contact surface provided on the other of the cover or the baseplate, wherein the mating pin is configured to contact the elastic contact surfaces when the inner pod is assembled, and
wherein the plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

2. The reticle pod of claim 1, wherein the elastic contact surface is provided on an elastic body, the elastic body including a hollow portion opposite a surface where the mating pin is configured to contact said elastic contact surface.

3. The reticle pod of claim 1, wherein each of the mating pins is disposed in a mating pin channel, each mating pin channel formed in the one of the cover or the baseplate.

4. A reticle pod, comprising:
an inner pod including a baseplate and a cover, wherein:
the inner pod includes at least one gross alignment feature and a plurality of motion limiting features, each of the plurality of motion limiting features including:
a diaphragm disposed in one of the cover or the baseplate;
a pin extending from the other of the cover or the baseplate, the pin configured to contact the diaphragm when the inner pod is assembled;
wherein the diaphragm has a resistance to deformation in a direction in plane with the cover or the baseplate that is greater than a resistance to deformation in a direction perpendicular to a plane of the cover or the baseplate, and
each of the pins have a taper at an end configured to contact one of the plurality of diaphragms,
wherein the plurality of motion limiting features are configured such that when a force having a component parallel to a plane of the baseplate or the cover is applied to the inner pod, at least one of the plurality of motion limiting features provides resistance to the force prior to the at least one gross alignment feature providing resistance to the force.

5. The reticle pod of claim 4, wherein each of the motion limiting features includes an alignment retention cutout configured to accommodate the diaphragm and a retention ring configured to retain the diaphragm in the alignment retention cutout.

6. The reticle pod of claim 4, wherein the pin is disposed in a pin channel formed in the one of the cover or the baseplate.

* * * * *